US008477463B2

(12) United States Patent
Ms (10) Patent No.: US 8,477,463 B2
(45) Date of Patent: Jul. 2, 2013

(54) VIBRATION BASED USER INPUT FOR MOBILE DEVICES

(75) Inventor: Ajith Ms, Bangalore (IN)

(73) Assignee: LSI Corporation, Milpitas, CA (US)

( * ) Notice: Subject to any disclaimer, the term of this patent is extended or adjusted under 35 U.S.C. 154(b) by 881 days.

(21) Appl. No.: 12/243,976

(22) Filed: Oct. 2, 2008

(65) Prior Publication Data

US 2010/0085216 A1    Apr. 8, 2010

(51) Int. Cl.
*H02H 7/06* (2006.01)
(52) U.S. Cl.
USPC .......................................................... 361/20
(58) Field of Classification Search
USPC .................................................... 341/20–34
See application file for complete search history.

(56) References Cited

U.S. PATENT DOCUMENTS

| 5,152,401 A * | 10/1992 | Affeldt et al. ................. 209/556 |
| 2006/0211499 A1* | 9/2006 | Bengtsson et al. .............. 463/47 |
| 2009/0027233 A1* | 1/2009 | Li ................................... 341/20 |

* cited by examiner

*Primary Examiner* — Rexford Barnie
*Assistant Examiner* — Christopher Clark
(74) *Attorney, Agent, or Firm* — Raj Abhyanker, P.C.

(57) ABSTRACT

A method, system, and apparatus of a vibration based user input for mobile devices are disclosed. In one embodiment, a method of controlling an electronic device includes receiving an impact signal, (e.g., a vibration generated by a user controlled impact with a surface mechanically coupled to a housing of the electronic device). The method further includes identifying a user command to the electronic device based on the impact signal, and performing a predesignated action (e.g., a mute, a power on, a power off, a volume increase, a volume decrease, a music track change, a call redirect, a call directed to voicemail, etc.) based on the user command. The user command may be identified using a number of user controlled impacts and an interval between a prior user controlled impact and a later user controlled impact.

20 Claims, 5 Drawing Sheets

VIBRATION BASED USER INPUT FOR MOBILE DEVICES

FIELD OF TECHNOLOGY

This disclosure relates generally to an enterprise method, a technical field of software and/or hardware technology and, in one example embodiment, to a vibration based user input for mobile devices.

BACKGROUND

A control for an electronic device (e.g., a mobile device, a laptop, a car navigation system, a stress sensor, a car audio, an underwater sensor, etc.) may require a particular user input (e.g., a touch, a movement, a sound, etc.) to control a function (e.g., a mute, a voicemail, a volume, a track control, a call disconnect, a speed, a door control, etc.) of an electronic device.

The particular user input may involve a direct contact with a limited area surface (e.g., a button, a touchpad, etc.). The limited area surface may require user to view the limited area surface to interact with it. In addition, the limited area surface may also require a user to extract the electronic device from a container (e.g., a pocket, a wallet, a purse, a protective case, a cover, etc.). These requirements may cause a delay (e.g., a time to extract the device from the container, a time to locate the limited area surface, etc.) and/or may cause a user to decide not to access the device. The delay or the failure to access the device may result in a disturbance (e.g., a phone ring) and/or an undesired result (e.g., a missed call, a transfer to voicemail, a different music track, a distraction, a loss of vehicle control, a missed direction, etc.). The undesired result may further result in an additional delay and/or inefficiency (e.g., an access to voicemail, a u-turn to find a missed location, a repeat of an already heard audio segment, etc.)

The limited area surface may also contain a moving part (e.g., a button mechanism) and/or an unsealed edge (e.g., a crack next to a touchpad edge and/or a button edge). The moving part may allow a foreign substance (e.g., a fluid and/or a dirt) to enter a housing for the electronic device. The foreign substance may accelerate a breakdown of the moving part and/or a component of the electronic device (e.g., a processor, a memory, a hard drive, a speaker, a microphone, etc.). The breakdown of the moving part and/or the component of the electronic device may prevent the electronic device from operating, which may result in a further delay and/or inefficiency (e.g., a repair cost, a replacement cost, etc.).

In addition, the particular user input may involve a sound greater than a threshold volume. By exceeding the threshold volume, the sound may cause a disturbance. The audible sound may also be easily generated by environmental sources, which may cause the electronic device to be controlled in undesired ways (e.g., a call disconnect, a mute, a video end, a power on, a power off, etc.). These undesired effects may also result in a delay and/or inefficiency.

SUMMARY

A method, system, and apparatus of a vibration based user input for mobile devices are disclosed. In one aspect, a method of controlling an electronic device includes receiving an impact signal (e.g., a vibration generated by a user controlled impact with a surface mechanically coupled to a housing of the electronic device), identifying a user command to the electronic device based on the impact signal, and performing a predesignated action based on the user command.

The user command may be identified using a number of user controlled impacts and an interval between a prior user controlled impact and a later user controlled impact. The method may include determining the predesignated action based on a context of the electronic device. The method may also include a user controlled impact generated when a user causes a physical object to contact a second physical object above a threshold velocity and a threshold force. The first physical object may be coupled to a user's hand (e.g., a user's finger, a user's arm, a user's elbow, a stylus, a pen, a pencil, etc.) and/or foot (e.g., a toe, a heel, a shoe, a knee, etc.). The second physical object (e.g., a table top, an automobile dashboard, a bridge support structure, a purse, a wallet, a mobile device protective cover, etc.) may be mechanically coupled to a housing of the electronic device. The second physical object may include a housing of the electronic device. The housing for the electronic device may include a sealed exterior, and the electronic device may be submersible.

The method may include distinguishing an impact signal from an other signal by a frequency of the vibration caused by the user controlled impact. The vibration receiver may be a microphone. The user command may be identified using a frequency, an amplitude, a signal duration, a frequency spectrum, a signal energy, a signal rising edge, a signal falling edge, a signal start, a signal end, a mechanically transmitted vibration, a duration between impacts, a number of impacts, and/or a device context to identify the impact signal as an impact command. The user command may be identified by any characteristic that differentiates between signals.

The predesignated action may include a mute, a power on, a power off, a volume increase, a volume decrease, a program end, a program beginning, a music track change, a call redirect, a call directed to voicemail, an instruction to transmit data, an advance to a next program, an instruction to receive data, an instruction to execute a mechanical action, an image capture, an auditory signal capture, a recording start, a recording end, a display change, an indicator light change, a sound generation, a vibration generation, a locking, an unlocking, a speakerphone control, an emergency call, and/or a car navigation instruction. The predesignated action may further include control of an underwater electronic device (e.g., a sensor, a camera, etc.) The predesignated action may also include any other action controllable by an electronic device.

In another aspect, a system to control an electronic device includes a vibration sensing module to receive an impact signal including a vibration generated by one user controlled impact with a surface mechanically coupled to the electronic device, an interpretation module to identify the auditory impact signal as a command to the electronic device, and a central processing module to execute a predesignated action based on the command.

The user command may be identified using a number (e.g., a quantity, a total number) of user controlled impacts and an interval (e.g., a delay, a period of time) between a prior user controlled impact and a later user controlled impact. The predesignated action executed by the central processing module may be determined based on a context of the electronic device when the impact signal may be received. The impact signal may be generated when a user causes a physical object to contact a second physical object above a threshold velocity. The first physical object may be coupled to a user's hand and/or foot, and the second physical object may be mechanically coupled to a housing of the electronic device.

In yet another aspect, a method includes forming a vibration sensing module in a electronic device to receive an impact signal, in which the impact signal includes a vibration generated by a user controlled impact with a surface mechanically coupled to a vibration receiver of the electronic device. The method further includes placing a differentiation module in the electronic device to identify the auditory impact signal as a command to the electronic device, creating a translation module in the electronic device to translate the command into a binary number, and forming a central processing module in the electronic device to execute a predesignated action based on the value of the binary number.

The user command may be identified using a number (e.g., a quantity) of user controlled impacts and/or an interval between a prior user controlled impact and a later user controlled impact. The central processing module may determine the predesignated action based on a context of the electronic device when the vibration sensing module may receive a vibration generated by a user controlled impact. The impact signal may be generated when a user causes a physical object to contact a second physical object above a threshold velocity.

The methods, systems, and apparatuses disclosed herein may be implemented in any means for achieving various aspects, and may be executed in a form of a machine-readable medium embodying a set of instructions that, when executed by a machine, causes the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method, system, and apparatus of a vibration based user input for mobile devices are disclosed. Although the present embodiments have been described with reference to specific example embodiments, it will be evident that various modifications and changes may be made to these embodiments without departing from the broader spirit and scope of the various embodiments.

In one embodiment, a method of controlling an electronic device 150 includes receiving an impact signal (e.g., a vibration generated by a user controlled impact), identifying a user command to the electronic device 150 based on the impact signal, and performing a predesignated action based on the user command.

Figure 2:
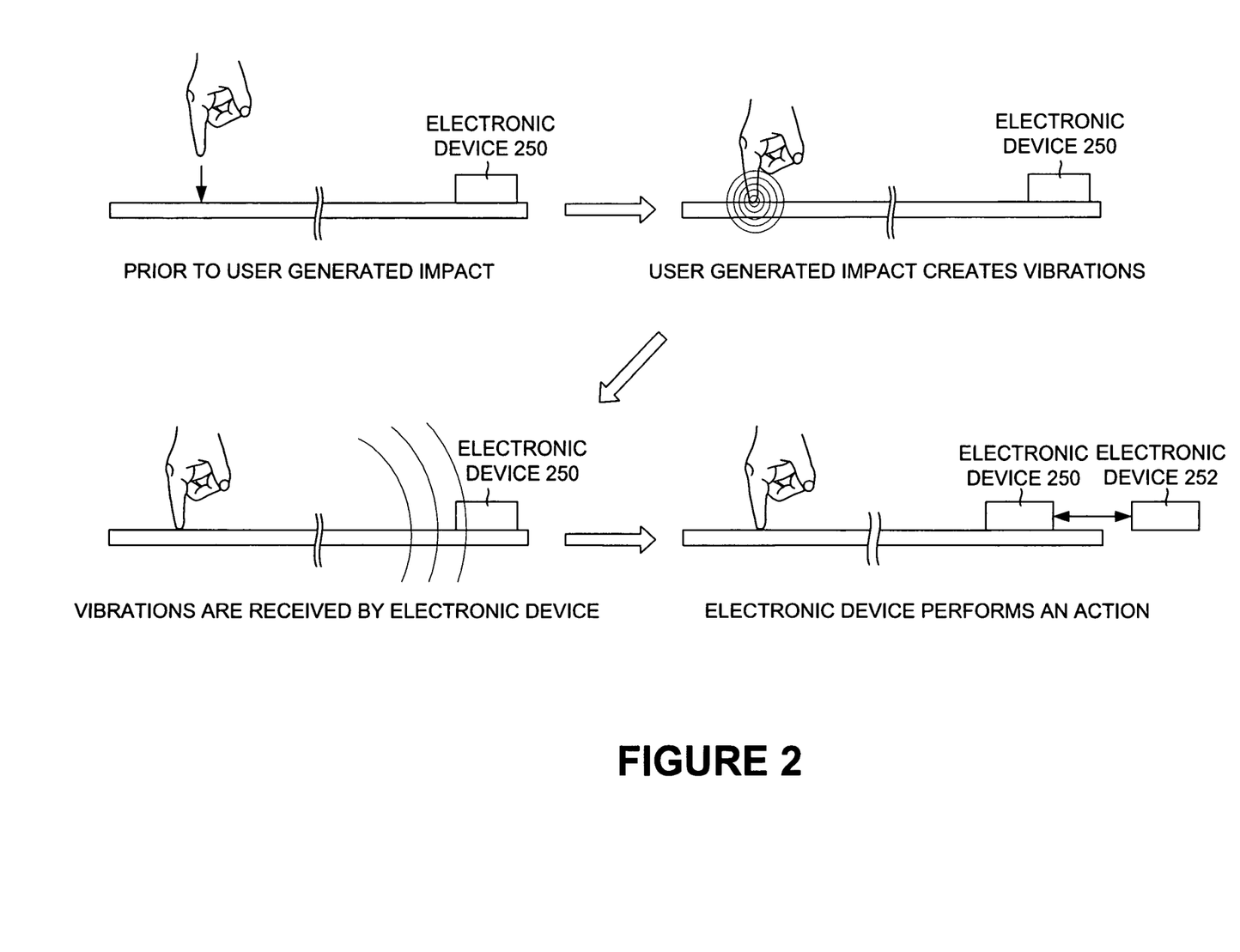
FIG. 2 is a system view illustrating receiving a vibration from a user generated impact and performing an action, according to one embodiment.

In another embodiment, a system to control an electronic device 150 includes a vibration sensing module 104 to receive an impact signal including a vibration generated by a user controlled impact with a surface mechanically coupled to the electronic device 150 (e.g., as illustrated in FIG. 2). The system further includes an interpretation module 100 to identify the auditory impact signal as a command to the electronic device 150, and a central processing module 106 to execute a predesignated action based on the command.

In yet another embodiment, a method includes forming a vibration sensing module (e.g., the vibration sensing module 104 of FIG. 1) in an electronic device (e.g., the electronic device 150, 250, and/or 252) to receive an impact signal that includes a vibration generated by a user controlled impact with a surface mechanically coupled to a vibration receiver of the electronic device. The method further includes placing a differentiation module (e.g., the differentiation module 102 of FIG. 1) in the electronic device 150 to identify the auditory impact signal as a command to the electronic device 250, creating a translation module in the electronic device (e.g., the electronic device 150, 250, and/or 252) to translate the command into a binary number, and forming a central processing module 106 in the electronic device to execute a predesignated action based on the value of the binary number.

Figure 1:
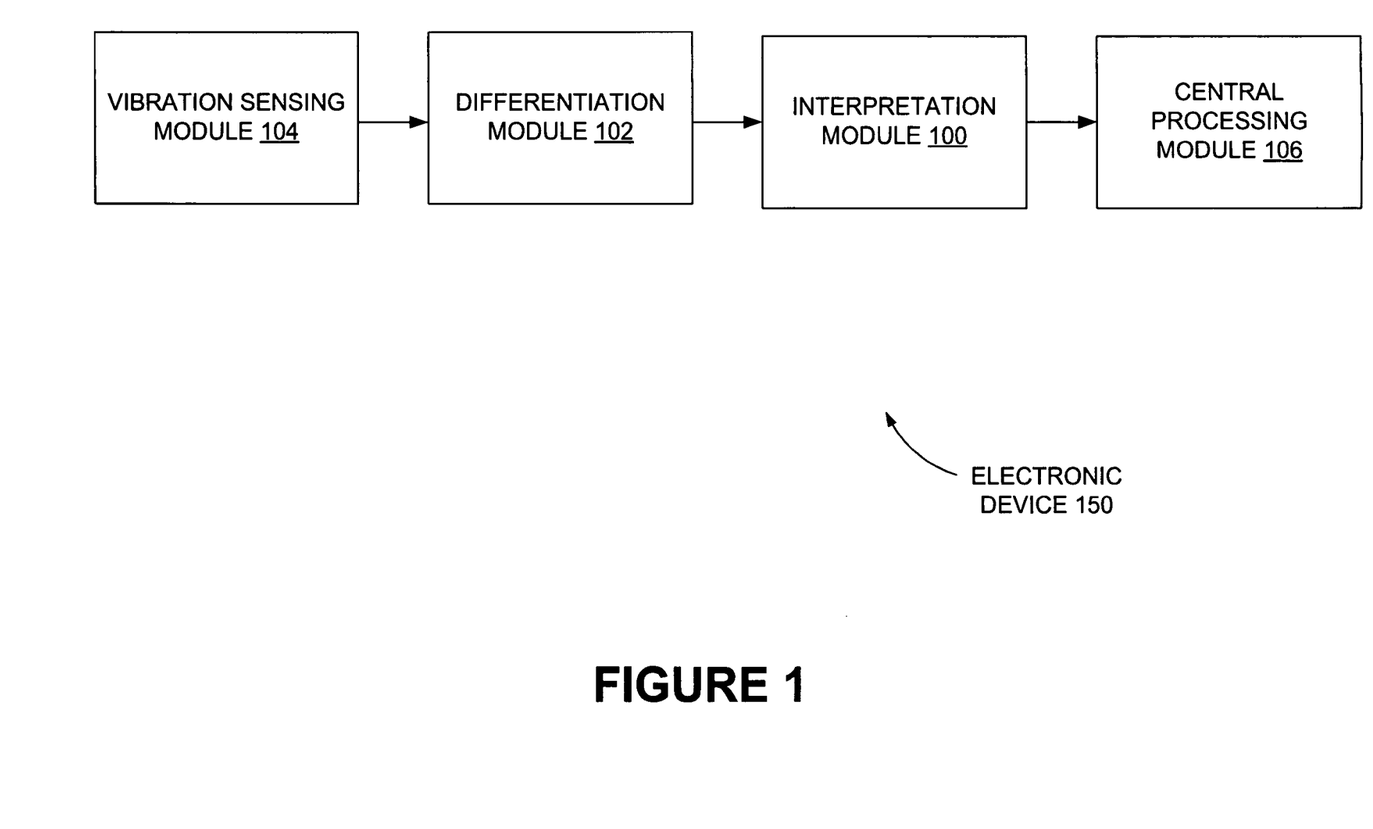
FIG. 1 is a system view of a electronic device, according to one embodiment.

FIG. 1 is a system view of the electronic device (e.g., the electronic device 150, 250, and/or 252), according to one embodiment. In particular, FIG. 1 illustrates an interpretation module 100 (e.g., a translation module), a differentiation module 102, a vibration sensing module 104, a central processing module 106, and an electronic device 150, according to one embodiment.

The interpretation module 100 (e.g., a translation module) may identify the auditory impact signal (e.g., vibrations, a tap, etc.) as a command to the electronic device. The interpretation module 100 may be a hardware unit and/or software unit that may convert the vibration patterns into binary numbers to provide to the processor (e.g., the central processing module 106). The interpretation module 100 may also be configured to receive and/or interpret binary numbers (e.g., 0s and 1s) coming from the previous stage (e.g., the differentiation module 102). The interpretation module 100 may also be configured to measure the time gap between two or more consecutive vibration inputs. The interpretation module 100 may also include a timeout logic that may indicate the end of a particular vibration pattern (e.g., the output of the vibration sensing module 104).

The differentiation module 102 may be a circuit (e.g., a squelch circuit) that may differentiate between an impact (e.g., a tap) deliberately generated by a user and a background noise and/or a random impact. The differentiation module 102 may isolate strong vibrations and may transmit them to an other module (e.g., the translation module). The differentiation module 102 may output a "0" which may be generated when the differentiation module 102 receives a low amplitude vibration (e.g., a vibration below a threshold value) and/or an alternate vibration (e.g., a vibration distinguishable from a user generated impact). The differentiation module 102 may output a "1" which may be generated when the differentiation module 102 receives a strong vibration (e.g., a vibration above a threshold value) and/or an identifiable user generated vibration. The "0" may represent a low logic level, and the "1" may represent a high logic level.

The vibration sensing module 104 may receive an impact signal that includes the vibration generated by the user controlled impact with a surface mechanically coupled to the electronic device 150. The vibration sensing module 104 may include a microphone that receives the impact signal. The microphone may already be present in a mobile device (e.g., a phone, a pda, a mobile headset, a laptop, etc.) and/or a sensor (e.g., a stress sensor, an embedded strain sensor, etc.).

The central processing module 106 may execute a predesignated action based on the command. The predesignated action may be determined using a look up table, which may relate a vibration pattern to a predesignated action. The predesignated action may be determined based on a context of the electronic device 150 when the impact signal may be received by the central processing module 106.

The electronic device 150 may be a communication device (e.g., a wireless network card, a cellular phone, etc.) that may use network of specialized base stations known as cell sites and/or a portable electronic device (e.g., an mp3 player, a laptop, a CD player, a movie player, a PDA etc.). The electronic device 150 may be watertight and may be submerged while receiving an impact signal and performing a predesignated action.

In an example embodiment, the electronic device 150 may include the vibration sensing module 104, the differentiation module 102, the interpretation module 100, and the central processing module 106. The vibration sensing module 104 may sense the vibrations and may communicate the output to the differentiation module 102. The interpretation module 100 may take and/or receive input signals (e.g., the logic high and/or the logic low signals) from the differentiation module 102. The interpretation module 100 may provide the output signals to the central processing module 106.

In one embodiment, the impact signal (e.g., a vibration generated by a user controlled impact) may be received, and the signal may be received with a vibration sensing module 104. The user may identify (e.g., using an interpretation module 100) the command to the electronic device 150 based on the impact signal. The predesignated action may be performed (e.g., using a central processing module 106) based on the user command. The user command may be identified using a number and/or a quantity of user controlled impacts. The user command may be identified using an interval between a prior user controlled impact and a later user controlled impact.

The predesignated action may be determined (e.g., using the central processing module 106) based on a context of the electronic device 150. The user controlled impact may occur when a user causes a physical object to contact a second physical object above a threshold velocity and a threshold force.

A system may control an electronic device (e.g., the electronic device 150, 250, and/or 252). The electronic device may include a vibration sensing module 104. The vibration sensing module 104 may receive an impact signal, and the impact signal may include a vibration generated by one or more user controlled impacts with a surface mechanically coupled to the electronic device.

The interpretation module 100 (e.g., a translation module) may identify the impact signal (e.g., an auditory signal, a vibration transferred through a mechanical coupling, etc.) as a command to the electronic device 150. The central processing module 106 may execute a predesignated action based on the command. The user command may be identified using a number of user controlled impacts. The user command may be identified by an interval between a prior user controlled impact and a later user controlled impact. The first physical object may be coupled to a user's hand and/or foot, and the second physical object may be mechanically coupled to a housing of the electronic device 150.

FIG. 2 is a system view illustrating receiving a vibration from a user generated impact and performing an action, according to one embodiment. In particular, FIG. 2 illustrates an electronic device 250, and an electronic device 252, according to one embodiment.

The electronic device 250 may be a communication device (e.g., a wireless, cellular phone, etc.) and/or a portable electronic device (e.g., a pda, a laptop, an mp3 player, a multimedia player, a cd player, etc.). The electronic device 250 may perform a predesignated action after receiving the command, including a power on, a power off, a volume increase, a volume decrease, a program end, a program beginning, a music track change, a call redirect, a call directed to voicemail, an instruction to transmit data, an advance to a next program, an instruction to receive data, an instruction to execute a mechanical action, and/or an image capture. The predesignated action may include an auditory signal capture, a recording start, a recording end, a display change, an indicator light change, a sound generation, a vibration generation, a locking, an unlocking, a speakerphone control, an emergency call, and/or a car navigation instruction, etc. The predesignated action may relate to a watertight electronic device (e.g., a waterproof mp3 player, an underwater camera, etc.) The user command may be identified using a number of user controlled impacts and/or an interval between a prior user controlled impact and a later user controlled impact.

The electronic device 252 may be a mobile device (e.g., a wireless phone, a cellular connection) and/or a portable electronic device. The electronic device 252 may perform a predesignated action when a command is received.

In an example embodiment, the electronic device 250 may receive a vibration from the impact of the finger of the user, and the electronic device 250 may perform the predesignated action after the vibration has been received. The impact generated by the user's finger may create vibrations, which may be received by the electronic device 250. The electronic device (e.g., the electronic device 150, 250, and/or 252) may perform the predesignated action after the vibrations are received.

In one embodiment, the first physical object may be coupled to a user's hand (e.g., a user's finger, a user's arm, a user's elbow, a stylus, a pen, a pencil, etc.) and/or foot (e.g., a toe, a heel, a shoe, a knee, etc.). The second physical object (e.g., a table top, an automobile dashboard, a bridge support structure, a purse, a wallet, a mobile device protective cover, etc.) may be mechanically coupled to a housing of the electronic device 250. The first physical object may be a user's finger and/or toe. The second physical object may include a housing of the electronic device 250. The impact signal may be distinguished from an other signal by a frequency of the vibration caused by the user controlled impact.

The vibration receiver may be a microphone, and the user command may be identified using a frequency, an amplitude, a signal duration, a frequency spectrum, a signal energy, a signal rising edge, and a signal falling edge. The user command may further be identified by a signal start, a signal end, a mechanically transmitted vibration, a duration between impacts, a number of impacts, and a device context (e.g., a power condition, an incoming call, a volume on, etc.).

The predesignated action may include a mute, a power on, a power off, a volume increase, a volume decrease, a program end, a program beginning, a music track change, a call redirect, a call directed to voicemail, an instruction to transmit data, an advance to a next program, an instruction to receive data, an instruction to execute a mechanical action, an image capture, an auditory signal capture, a recording start, a recording end, a display change, an indicator light change, a sound generation, a vibration generation, a locking, an unlocking, a speakerphone control, an emergency call, and/or a car navigation instruction.

The vibration sensing module 104 may receive an impact signal that includes a vibration generated by a user controlled impact. The impact may involve a surface mechanically coupled to a vibration receiver of the electronic device (e.g., the electronic device 150, 250, 252). The differentiation module 102 may identify the auditory impact signal as a command to the electronic device 250 of FIG. 2. The translation module may be created in the electronic device 250 that may translate the command into a binary number. The central processing module (e.g., the central processing module 106 of FIG. 1) may be formed in the electronic device 252 of FIG. 2. The central processing module 106 may execute a predesignated action based on the value of the binary number.

The user command may be identified using a number of user controlled impacts and/or an interval between a prior user controlled impact and a later user controlled impact. The central processing module 106 may determine the predesignated action based on a context of the electronic device (e.g., the electronic device 150, 250, and/or 252) when the vibration sensing module 104 receives a vibration generated by a user controlled impact. The impact signal may be generated when a user causes a physical object to contact a second physical object above a threshold velocity and/or force. The predesignated action may be executed by the central processing module 106, and the predesignated action may be determined based on a context of the electronic device 252 at the time the impact signal is received.

Figure 3:
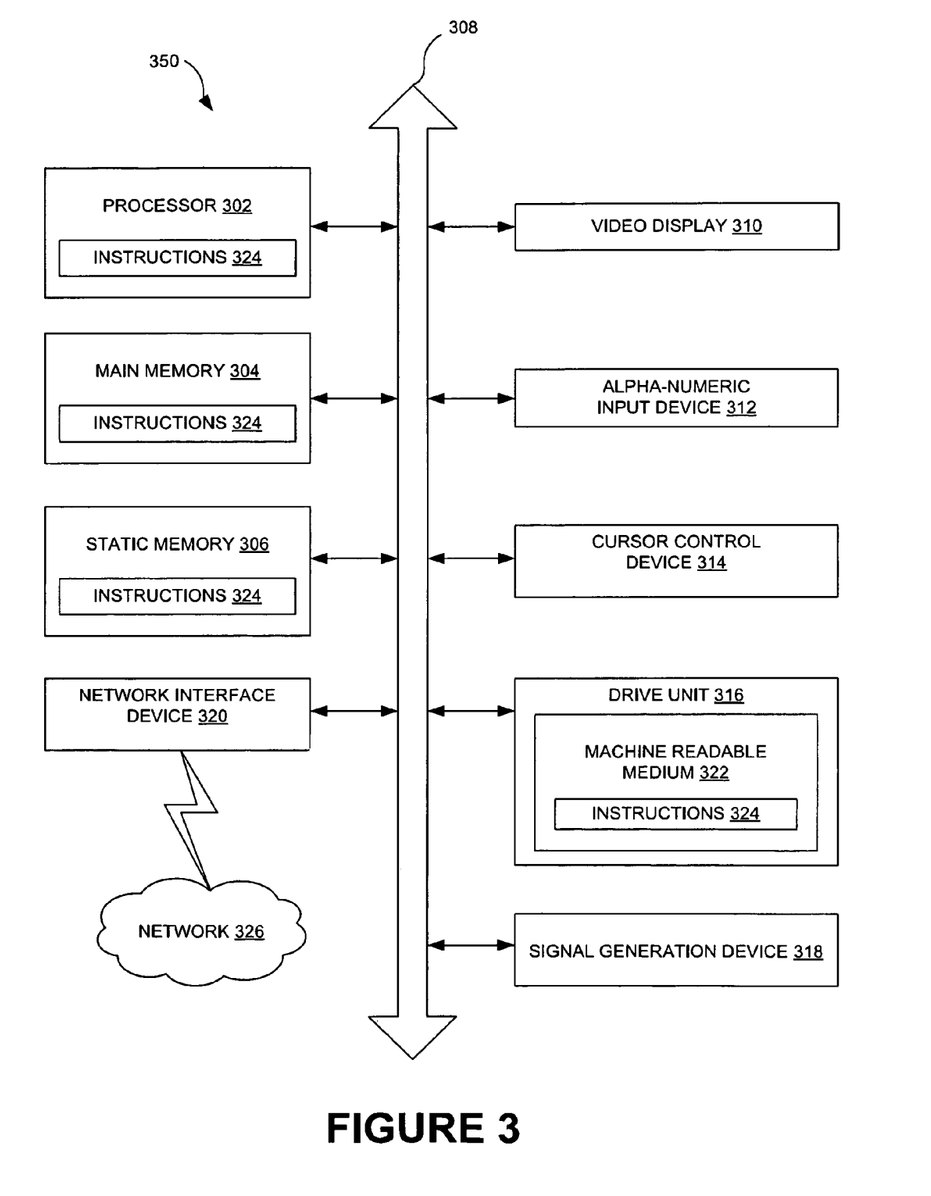
FIG. 3 is a diagrammatic system view of a data processing system in which any of the embodiments disclosed herein may be performed, according to one embodiment.

FIG. 3 is a diagrammatic system view of a data processing system in which any of the embodiments disclosed herein may be performed, according to one embodiment. In particular, the diagrammatic system view 300 of FIG. 3 illustrates a processor 302, a main memory 304, a static memory 306, a bus 308, a video display 310, an alpha-numeric input device 312, a cursor control device 314, a drive unit 313, a signal generation device 318, a network interface device 320, a machine readable medium 322, instructions 324, and a network 326, according to one embodiment.

The diagrammatic system view 300 may indicate a personal computer and/or the data processing system in which one or more operations disclosed herein are performed. The processor 302 may be a microprocessor, a state machine, an application specific integrated circuit, a field programmable gate array, etc. (e.g., an Intel® Pentium® processor). The main memory 304 may be a dynamic random access memory and/or a primary memory of a computer system.

The static memory 306 may be a hard drive, a flash drive, and/or other memory information associated with the data processing system. The bus 308 may be an interconnection between various circuits and/or structures of the data processing system. The video display 310 may provide a graphical representation of information on the data processing system. The alpha-numeric input device 312 may be a keypad, a keyboard and/or any other input device of text (e.g., a special device to aid the physically handicapped).

The cursor control device 314 may be a pointing device such as a mouse. The drive unit 316 may be the hard drive, a storage system, and/or other longer term storage subsystem. The signal generation device 318 may be a bios and/or a functional operating system of the data processing system. The network interface device 320 may be a device that performs interface functions such as code conversion, protocol conversion and/or buffering required for communication to and from the network 326. The machine readable medium 322 may provide instructions on which any of the methods disclosed herein may be performed. The instructions 324 may provide source code and/or data code to the processor 302 to enable any one or more operations disclosed herein.

Figure 4:
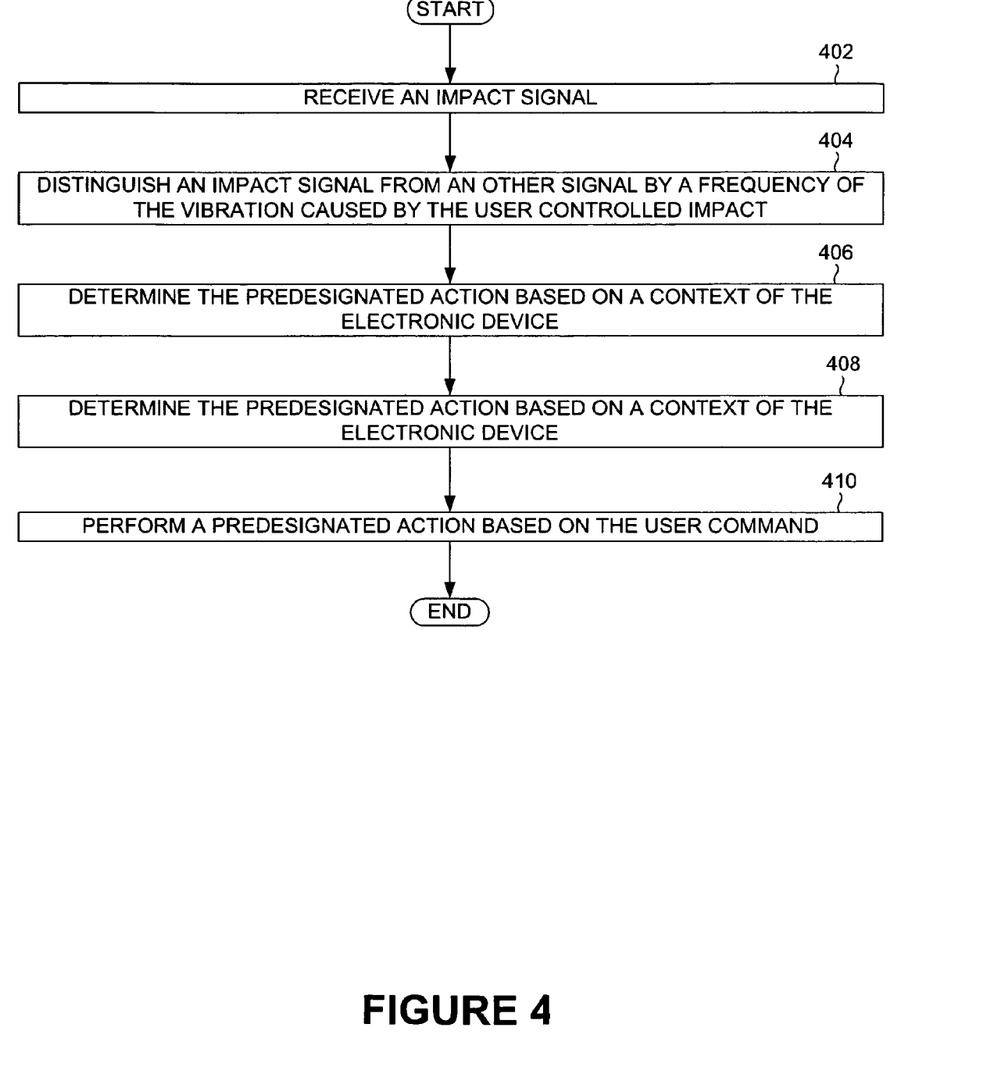
FIG. 4 is a process flow illustrating receiving the user controlled impact and performing an action, according to one embodiment.

FIG. 4 is a process flow illustrating receiving the user controlled impact and performing an action, according to one embodiment. In operation 402, an impact signal (e.g., a vibration generated by one user controlled impact with a surface mechanically coupled to a housing of the electronic device 150) may be received. The impact signal may be received using the vibration sensing module 104 of FIG. 1.

In operation 404, an impact signal may be distinguished from an other signal by a frequency of the vibration caused by the user controlled impact. The vibration receiver may be a microphone.

In operation 406, a user may identify the command to the electronic device 150 based on the impact signal. The user command may be identified using a frequency, an amplitude, a signal duration, a frequency spectrum, a signal energy, a signal rising edge, a signal falling edge, a signal start, a signal end, a mechanically transmitted vibration, a duration between impacts, and/or a number of impacts and/or a device context to identify the impact signal as an impact command.

In operation 408, the predesignated action may be determined based on a context (e.g., an electronic device operation, a power status, a ringer operation, an open communication with another person using another electronic device, etc.) of the electronic device 150. The user controlled impact may occur when a user may cause a physical object to contact a second physical object above a threshold velocity and/or a threshold force.

The first physical object may be coupled to a user's hand (e.g., a user's finger, a user's arm, a user's elbow, a stylus, a pen, a pencil, etc.) and/or foot (e.g., a toe, a heel, a shoe, a knee, etc.). The first physical object may be a user's finger and/or toe. The second physical object (e.g., a table top, an automobile dashboard, a bridge support structure, a purse, a wallet, a mobile device protective cover, etc.) may be mechanically coupled to and/or include a housing of the electronic device 150.

In operation 410, a predesignated action may be performed based on the user command. The user command may be identified using a number of user controlled impacts and/or an interval between a prior user controlled impact and a later user controlled impact. The predesignated action may include a mute, a power on, a power off, a volume increase, a volume decrease, a program end, a program beginning, a music track change, a call redirect, a call directed to voicemail, an instruction to transmit data, an advance to a next program, an instruction to receive data, an instruction to execute a mechanical action, an image capture, an auditory signal capture, a recording start, a recording end, a display change, an indicator light change, a sound generation, a vibration generation, a locking, an unlocking, a speakerphone control, an emergency call and/or a car navigation instruction.

Figure 5:
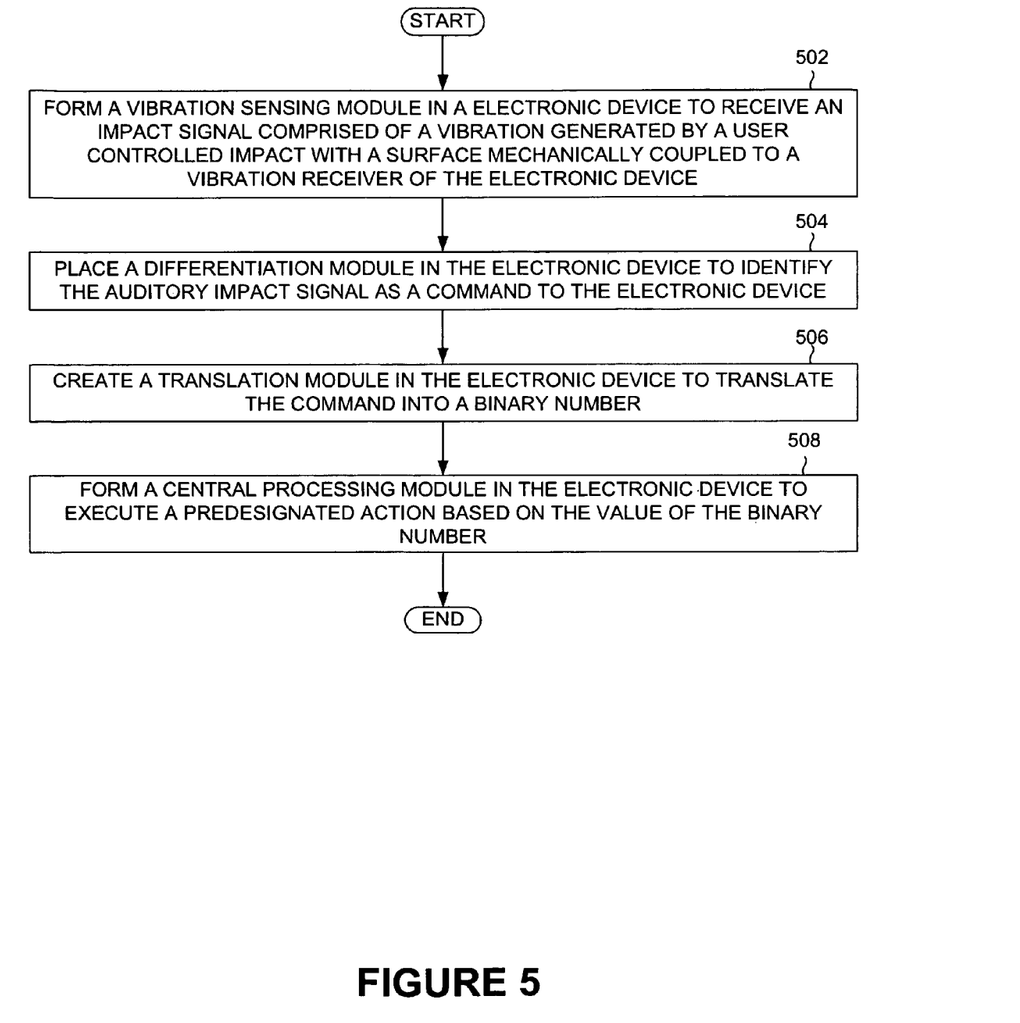
FIG. 5 is a process flow illustrating forming various modules for receiving a vibration from a user generated impact and performing an action, according to one embodiment.

FIG. 5 is a process flow illustrating forming various modules for receiving a vibration from a user generated impact and performing an action, according to one embodiment.

In operation 502, a vibration sensing module (e.g., the vibration sensing module 104 of FIG. 1) may be formed in the electronic device 250. The vibration sensing module may receive an impact signal that may include a vibration generated by a user controlled impact with a surface mechanically coupled to a vibration receiver of the electronic device 250. In operation 504, a differentiation module (e.g., the differentiation module 102 of FIG. 1) may be placed in the electronic device 150 that may identify the auditory impact signal as a command to the electronic device 250. In operation 506, a translation module may be created in the electronic device 250 that may translate the command into a binary number.

In operation 508, a central processing module (e.g., the central processing module 106 of FIG. 1) may be formed in the electronic device 252. The central processing module may execute a predesignated action based on the value of the binary number. The user command may be identified using a number of user controlled impacts and an interval between a prior user controlled impact and a later user controlled impact. The central processing module 106 may determine the predesignated action based on a context of the electronic device 252 when the vibration sensing module 104 receives a vibration generated by a user controlled impact. The impact signal may be generated when a user causes a physical object to contact a second physical object above a threshold velocity.

In an example embodiment, the user may be in a meeting when the user's electronic device 150 (e.g., the mobile device) may begin ringing loudly and/or vibrating in a pants pocket. When this occurs, the user may tap on a housing for the electronic device through the user's pocket in a specific sequence to silence the electronic device 150. This may allow the electronic device to be silenced without removing the electronic device from the user's pocket.

The electronic device 150 may include the vibration based interface that may take an input from the microphone and/or a vibration sensor. The microphone and/or the vibration sensor may be coupled to the body of the electronic device 150. The input from the sensor may be fed to a differentiation module 102 (e.g., the squelch circuit), which may differentiate between deliberate taps and other vibrations. The differentiation module 102 may use a strength of vibration to differentiate between an impact signal and a voice input. The differentiation module 102 may isolate a strong vibration and transfer it to the interpretation module 100. The output of the differentiation module 102 may be either the logic "0" (e.g., a logic low signal) and/or the logic "1" (e.g., a logic high signal). The differentiation module 102 may generate the logic high when it receives a strong vibration above a threshold duration and/or amplitude. The logic high signal may be given to the interpretation module 100. A silence and/or a vibration below a threshold level may be represented by the differentiation module 102 as the logic low.

The interpretation module 100 may be the hardware unit that converts the vibration pattern into the binary number. The binary number may be communicated to the processor (e.g., the central processing module 106) and/or may be implemented in software. The interpretation module 100 may acquire binary numbers (e.g., 0s and 1s) coming from the previous stage (e.g., the differentiation module 102). The interpretation module may also measure the time gap between two consecutive vibration inputs.

The interpretation module 100 may also include a timeout logic that may indicate the end of a particular vibration pattern (e.g., the output of the vibration sensing module 104). The central processing module 106 may execute a predesignated action based on the command. The predesignated action may be determined based on a context of the electronic device 150 when the impact signal is received. The predesignated action may be based upon a look up table that includes a vibration pattern that may be assigned to the action.

In the example embodiment, two rapid taps may be assigned as the byte 00000011. One tap, followed by a gap, followed by one tap may be assigned to the byte 00000101 in a lookup table. Two taps, followed by a gap, followed by one tap may be assigned to the byte 00001101 in the lookup table.

Various specific binary sequences may be assigned with particular actions such as:

00000011—Put the device in silent mode.
00000101—Ignore the incoming call.
00001101—Put the electronic device in vibration mode.

In particular, the interpretation module 100, the differentiation module 102, the vibration sensing module 104, and the central processing module 106 of FIGS. 1 to 5 may be enabled using an interpretation circuit, a differentiation circuit, a vibration sensing circuit, a central processing circuit, software and/or transistors, logic gates, and electrical circuits (e.g., application specific integrated ASIC circuitry) such as a personal communication circuit, a healthcare provider circuit, a dispatch circuit, and other circuits.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method of controlling an electronic device, comprising:
    sensing a vibration generated by a user associated with the electronic device through a sensor associated therewith, the vibration generating an impact signal through the sensor, and the sensor being one of a stress sensor and a strain sensor;
    utilizing a squelch circuit in the electronic device to assign a bit value based on the sensed vibration;
    identifying a user command to the electronic device based on the bit value; and
    automatically modifying a current setting on the electronic device solely based on the identified user command, the modification of the current setting being unrelated to transmission of character messages through the electronic device.

2. The method of claim 1, wherein the user command is identified using bit values based on at least one of a number of impacts and an interval between a prior impact and a later impact.

3. The method of claim 1, further comprising determining the modification of the current setting based on a context of the electronic device.

4. The method of claim 1, comprising generating the impact signal upon the user causing a physical object to contact a second physical object above at least one of a threshold velocity and a threshold force.

5. The method of claim 4, wherein the physical object is coupled to at least one of a hand and a foot of the user, and the second physical object is mechanically coupled to a housing of the electronic device.

6. The method of claim 5, wherein the first physical object is associated with a finger of the user.

7. The method of claim 5, wherein the second physical object is associated with the housing of the electronic device.

8. The method of claim 1, further comprising distinguishing the impact signal from another signal based on a frequency of the vibration associated therewith.

9. The method of claim 1, comprising additionally utilizing a microphone associated with the electronic device in conjunction with the sensor.

10. The method of claim 1, comprising identifying the user command using at least one of a frequency, an amplitude, a signal duration, a frequency spectrum, a signal energy, a signal rising edge, a signal falling edge, a signal start, a signal end, a mechanically transmitted vibration, a duration between impacts, a number of impacts, and a device context.

11. The method of claim 1, wherein the modification of the current setting includes at least one of a mute, a power on, a power off, a volume increase, a volume decrease, a program end, a program beginning, a music track change, a call redirect, a call directed to voicemail, an advance to a next program, an instruction to receive data, an instruction to execute a mechanical action, an image capture, an auditory signal capture, a recording start, a recording end, a display change, an indicator light change, a sound generation, a vibration generation, a locking, an unlocking, a speakerphone control, an emergency call, and a car navigation instruction.

12. A system to control an electronic device, comprising:
a sensor to sense a vibration generated by a user associated with the electronic device, the vibration generating an impact signal, and the sensor being one of a stress sensor and a strain sensor;
a squelch circuit to assign a bit value based on the sensed vibration;
an interpretation module to identify a command to the electronic device based on the bit value; and
a processing module to execute an automatic modification of a current setting on the electronic device solely based on the identified command, the modification of the current setting being unrelated to transmission of character messages through the electronic device.

13. The system of claim 12, wherein the command is identified using bit values based on at least one of a number of impacts and an interval between a prior impact and a later impact.

14. The system of claim 12, wherein the processing module is configured to determine the modification of the current setting based on a context of the electronic device upon receipt of the impact signal.

15. The system of claim 12, wherein the impact signal is generated upon the user causing a physical object to contact a second physical object above at least one of a threshold velocity and a threshold force.

16. The system of claim 15, wherein the physical object is coupled to at least one of a hand and a foot of the user, and the second physical object is mechanically coupled to a housing of the electronic device.

17. A method, comprising:
configuring a sensor associated with an electronic device to sense vibrations generated by a user associated with the electronic device, the vibrations generating an impact signal through the sensor, and the sensor being one of a stress sensor and a strain sensor;
utilizing a squelch circuit in the electronic device to assign bit values based on the sensed vibrations;
identifying a command to the electronic device based on the bit values;
translating, through the electronic device, the command into a binary number; and
automatically modifying, through a processing module in the electronic device, a current setting on the electronic device solely based on the value of the binary number, the modification of the current setting being unrelated to transmission of character messages through the electronic device.

18. The method of claim 17, comprising identifying the command using bit values based on at least one of a number of impacts and an interval between a prior impact and a later impact.

19. The method of claim 17, comprising determining, through the processing module, the modification of the current setting based on a context of the electronic device.

20. The method of claim 17, comprising generating the impact signal when the user causes a physical object to contact a second physical object above a threshold velocity.

* * * * *